United States Patent [19]

Bierig et al.

[11] 4,201,604
[45] May 6, 1980

[54] PROCESS FOR MAKING A NEGATIVE RESISTANCE DIODE UTILIZING SPIKE DOPING

[75] Inventors: Robert W. Bierig; S. Robert Steele, both of Sudbury, Mass.

[73] Assignee: Raytheon Company, Lexington, Mass.

[21] Appl. No.: 721,253

[22] Filed: Sep. 8, 1976

Related U.S. Application Data

[63] Continuation of Ser. No. 604,378, Aug. 13, 1975, abandoned.

[51] Int. Cl.² .................. H01L 21/205; H01L 29/90
[52] U.S. Cl. .................................. 148/175; 148/1.5; 148/33.5; 357/13; 357/15; 357/89; 357/90; 427/84
[58] Field of Search .................. 148/175, 33.5; 357/13, 357/15, 89, 90; 427/84

[56] References Cited

U.S. PATENT DOCUMENTS

| | | | |
|---|---|---|---|
| 3,668,555 | 6/1972 | Kasperkovitz | 357/89 X |
| 3,721,583 | 3/1973 | Blakeslee | 148/175 X |
| 3,739,243 | 6/1973 | Semichon et al. | 357/13 X |
| 3,762,945 | 10/1973 | DiLorenzo | 148/175 X |
| 3,831,068 | 8/1974 | Kniepkamp | 357/15 |
| 3,885,061 | 5/1975 | Corboy et al. | 148/175 X |
| 3,886,580 | 5/1975 | Calviello | 357/15 |
| 3,904,449 | 9/1975 | DiLorenzo et al. | 148/175 |
| 3,906,540 | 9/1975 | Hollins | 357/15 |

OTHER PUBLICATIONS

Schroeder et al., "Avalanche Region Width . . . Impatt Diodes", Proc. IEEE, vol. 59, No. 8, Aug. 1971, p. 1245-1248.
Sze et al., "Microwave Avalanche Diodes" Proc. IEEE, vol. 59, No. 8, Aug. 1971, pp. 1140-1154.
Salmer et al., "Theoretical . . . GaAs Impatt . . . Efficiency", J. Applied Physics, vol. 44, No. 1, Jan. 1973, pp. 314-324.

Primary Examiner—L. Dewayne Rutledge
Assistant Examiner—W. G. Saba
Attorney, Agent, or Firm—Richard M. Sharkansky; Joseph D. Pannone

[57] ABSTRACT

A modified Read-type diode having an extremely thin doping spike and with the electric field in the drift region terminated before the buffer zone. The buffer zone and a drift region are first grown upon a doped semiconductor substrate using epitaxial vapor deposition growth techniques employing a furnace tube within a multiple temperature zone reaction furnace. The doping spike is produced by injecting under pressure a fixed predetermined volume of dopant into the furnace tube. An avalanche region is grown over the doping spike and a Schottky barrier contact or semiconducting material of the opposite conductivity type grown over the avalanche region. Avalanche regions having a length less than 15% of the total active length of the device and doping spikes having a width of 500 Å or less are disclosed in a high-efficiency device.

14 Claims, 16 Drawing Figures

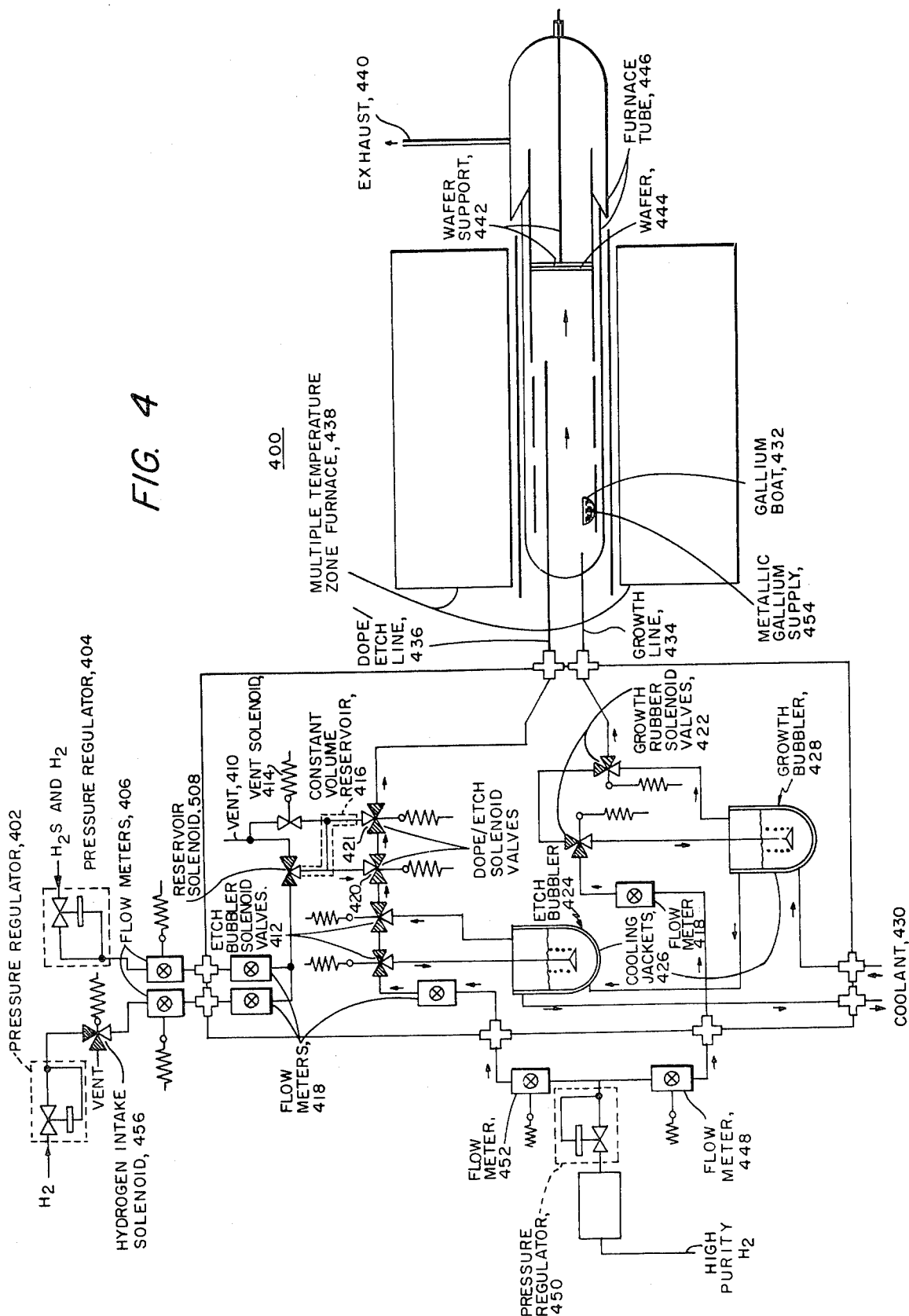

PROCESS FOR MAKING A NEGATIVE RESISTANCE DIODE UTILIZING SPIKE DOPING

CROSS-REFERENCE TO RELATED CASES

This is a continuation of application Ser. No. 604,378, filed Aug. 13, 1975, now abandoned.

BACKGROUND OF THE INVENTION

1. Field of the Invention

The invention relates to diodes having a dynamic negative resistance over a predetermined frequency range. More particularly, the invention relates to the class of dynamic negative resistance diodes known as IMPATT. More particularly still, the invention relates to a special type of IMPATT diode termed the Read diode.

2. Description of the Prior Art

The original structure used for Read diodes is shown in U.S. Pat. Nos. 2,899,646 and 2,899,652 both of Aug. 11, 1959, and both issued to W. T. Read, Jr. Such diodes basically comprise a semiconductor junction for producing an avalanche of charge carriers, a drift region of intrinsic or nearly intrinsic semiconductor material, and a highly doped buffer region for extracting charge carriers. A dynamic negative resistance is produced by fixing the length of the drift region such that charge carriers produced by the avalanche are delayed in their transit through the drift region such that they are recovered at the buffer zone 180° out of phase with the voltage across the diode but in-phase with the current flow through the diode.

Standard IMPATT diodes, on the other hand, were constructed using only three semiconductor layers, these diodes comprising a linear arrangement of three layers consisting of a layer of semiconductor material of a first conductivity type adjacent a center layer of the opposite conductivity type. A buffer zone of the same second conductivity type as the middle zone but of a much higher doping density provided a buffer zone for extraction of charged carriers, avalanching and drift both took place in the center region. As the efficiency of such diodes is related to the length of the drift region as compared with the length of the avalanche region and as both avalanching and drift took place within the same portion of semiconductor material of a uniform doping density, the efficiency of such diodes tended to be rather low. Read diodes promised to have a much higher efficiency than the original IMPATT diodes as the avalanching region was confined within the somewhat narrow portion of semiconductor material specifically provided as an avalanche zone.

However, Read-type diodes have heretobefore not been commercially successful for a number of practical reasons. Foremost among these reasons was the inability to provide a sufficiently thin avalanching region to make the efficiency of the Read diode greater than or even equal to the efficiency of the previously developed IMPATT diodes. Also, nonuniformities in the length of the avalanching region greatly affected the frequency response of the diodes causing the yield per processed wafer to be too low for practical production. A third and little recognized problem was that in the original Read-type diodes the electric field produced in the drift region necessary for causing the avalanche carriers to proceed through the drift region was made to extend up to and to be non-zero at the junction between the drift region and buffer zone. This presence of an electric field at this juncture caused the generation of minority carriers. The minority carriers were swept back into the drift region by the electric field through to the avalanche region. Here the minority carriers caused generation of further majority carriers by impact ionization within the avalanche zone. The majority carriers thusly generated were then swept back into the drift region out of phase with the carriers already produced having the proper phase relationship with external signals. The addition of this second group of majority carriers to the current within the drift region further lowered the efficiency of the device.

Furthermore, the relationship between the depth of the avalanche region and the efficiency of a Read-type diode device was imperfectly understood. No procedure existed for designing a practical device with proper avalanche region depth and proper doping levels so as to give a desired operating efficiency at a predetermined frequency.

SUMMARY OF THE INVENTION

Accordingly, it is an object of the present invention to provide a Read-type diode and method for producing the same in which the efficiency of the device is much higher than has hitherto been obtained.

It is also an object of the present invention to provide a Read-type diode and method for producing the same having a sufficiently thin avalanche region to permit the diode to have the desired increase deficiency.

Furthermore, objects of the invention are met by providing a modified Read-type diode in which the electric field within the drift region is terminated short of the buffer zone. Such a Read diode may be constructed by the use of a drift region having a heavier doping density than was previously employed.

The invention may also be practiced with a method for producing a diode device having a doping spike for terminating the avalanche region within the diode comprising the steps of vapor depositing a drift region layer of semiconductor material upon a substrate and injecting a predetermined quantity of a preselected dopant material wherein the predetermined quantity of dopant material is vapor deposited upon the drift region and forms a doping spike thereon. In the preferred embodiment, all of the semiconductor material comprises gallium arsenide. The aforerecited method may further comprise the step of vapor depositing an avalanche layer over the doping spike. The substrate is preferably located for the entire process within a furnace tube and the substrate is maintained at a predetermined temperature. The predetermined quantity of dopant material is stored in a reservoir having a predetermined volume. The dopant material is preferably selected from a group consisting of an arsenic compound, sulfur, tellurium, hydrogen sulfide, tin and selenium for an N-type substrate and zinc and cadmium for a P-type substrate.

The invention also includes a method for producing a modified Read-type diode device comprising the steps of providing a wafer of semiconductor material placed within a furnace tube the temperature of which is maintained at predetermined values, vapor depositing one or more buffer zones of semiconductor material upon the substrate wherein the substrate and buffer zone are both substantially highly doped, vapor depositing a drift region layer upon the buffer zone, the drift region layer being substantially lightly doped and the length of the drift region layer being determined in accordance with a preferred operating frequency of the device, vapor depositing a doping spike layer upon the drift region layer by injecting a predetermined quantity of dopant material within the furnace tube, vapor depositing an avalanche region layer upon the doping spike layer, and providing junction forming means upon the avalanche region layer. Gallium arsenide is preferably used for all semiconductor material. The junction forming means preferably comprises a Schottky barrier contact layer which in turn may comprise a layer of chromium upon the avalanche layer, a layer of titanium upon the layer of chromium, and one or more layers of gold upon the layer of titanium. The step of vapor depositing the doping spike may further comprise the steps of prestoring a predetermined quantity of dopant material in a reservoir having a predetermined volume, and injecting the predetermined quantity of dopant material into the furnace tube. The step of injecting may further comprise propelling the predetermined quantity of dopant material with a gas, that gas preferably being non-reactive with the materials within the furnace tube. The dopant material preferably comprises hydrogen sulfide and the gas comprises hydrogen.

Moreover, the invention may also be practiced with a method of determining the distance from the surface of an avalanche region of a Read-type diode device to the peak of a doping spike within that device which is used for terminating the avalanche region and for determining the peak doping density within the spike in accordance with a preferred operating efficiency and center operating frequency comprising the steps of providing parametric sets of graphs of center operating frequency plotted against the aforementioned distance and the change in electric field intensity from the edge of the avalanche region to the beginning of the drift region, the center operating frequency being varied as a parameter, one set of curves being provided for each of a plurality of doping densities of the drift region, providing parametric sets of graphs of operating efficiency plotted against the aforementioned distance and the change in electric field, the operating efficiency also being varied as a parameter, one set of curves being provided for each of the doping densities of the drift region to correspond with the first mentioned set of curves, and determining values of the center operating frequency and operating efficiency upon corresponding sets of curves for the same value of doping density of the drift region.

BRIEF DESCRIPTION OF THE DRAWINGS

FIG. 4 is a schematic diagram of apparatus used for producing the device of FIG. 1 using a method in accordance with the invention.

DESCRIPTION OF THE PREFERRED EMBODIMENTS

Figure 1:
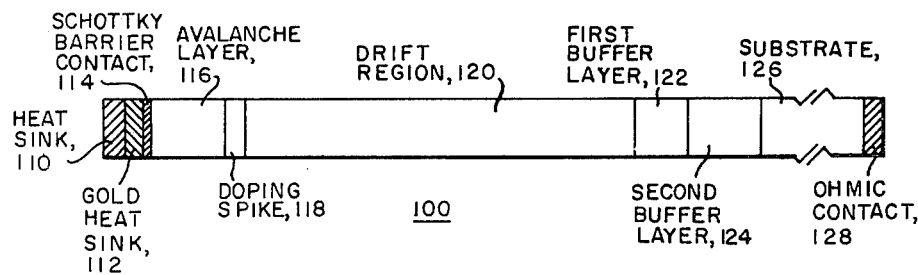
FIG. 1 is a cross-sectional view of a dynamic negative resistance diode constructed in accordance with the teachings of the invention.

FIG. 1 shows a cross-sectional view of a dynamic negative resistance-type diode in which the present invention is used to advantage. Such a device consists primarily of five or more regions of semiconductor material of varying doping densities of the same conductivity type and a Schottky barrier contact of five or more regions of semiconductor material of varying doping densities of one conductivity type and a fifth junction forming region of the opposite conductivity type. In the case illustrated in FIG. 1, Schottky barrier contact 114 forms a junction with avalanche layer 116. Schottky barrier contact 114 is preferably formed of gold, platinum or chromium. Gallium arsenide is the preferred semiconductor material used for each of the semiconductor regions although silicon can be used as well. Gallium arsenide is preferred as its ionization potential is less making an avalanche easier to generate and thereby increasing the overall efficiency of the diode. Alternatively, a region of P conductivity type could be used as well in place of Schottky barrier contact 114. Also, the opposite conductivity types could be used as well. For N-type gallium arsenide, sulfur, tellurium, tin and selenium may be used as N-type dopants and zinc and cadmium as P-type dopants. Avalanche region has a preferred doping density in the range of $6 \times 10^{15}$ to $6 \times 10^{16}$ atoms/cm$^3$.

Next to avalanche region 116 is located doping spike 118 having moderately heavy doping density. Doping densities in the range of $2 \times 10^{17}$ to $5 \times 10^{17}$ atoms/cm$^3$ are preferred. With the use of the method in accordance with the invention, a much narrower doping spike than has heretobefore been produced is made possible. Doping spike widths as low as 300–500 Å have been attained with the invention.

Next to doping spike 118 is located drift region 120. Drift region 120 has a moderate doping density preferably in the range of $3 \times 10^{15}$ to $3 \times 10^{16}$ atoms/cm$^3$. The length of drift region 120 is dependent upon the desired operating frequency of the device.

One or more buffer regions having heavy doping density complete the semiconductor regions of the device. Buffer region 122 has a typical doping density of $2 \times 10^{18}$ atoms/cm$^3$ making it a relatively low resistivity. A metal contact 128 is alloyed to buffer region 124 to allow attachment thereto of a lead. Similarly, a lead is attached to heat sink 110.

Figure 2:
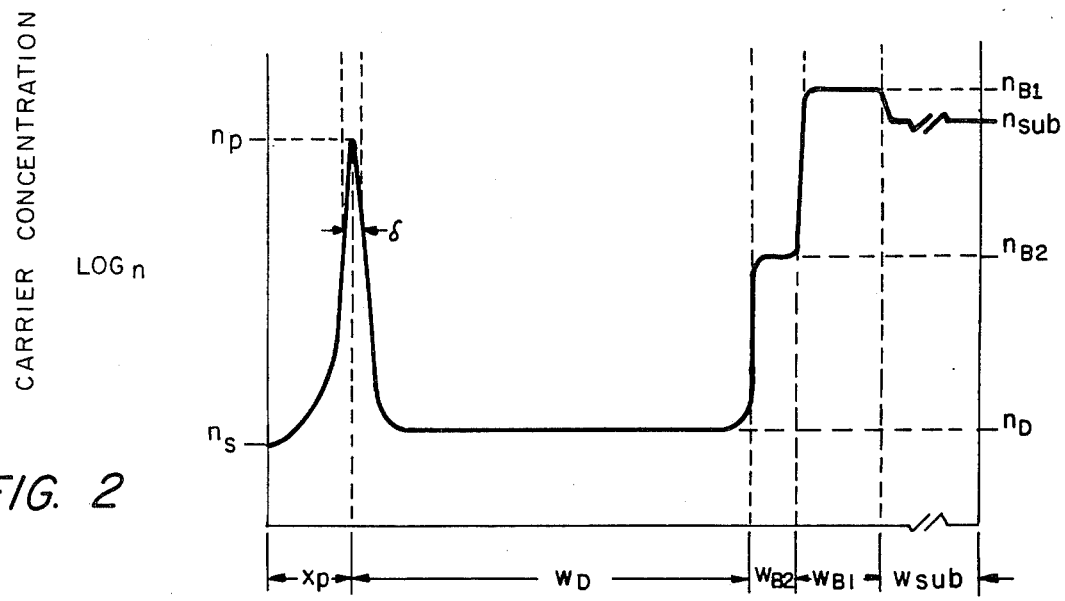
FIG. 2 is a graph of the doping density within the various regions of the device shown in FIG. 1.

FIG. 2 is a graph showing the doping densities in the various regions of the device in FIG. 1. The peak $n_p$ of doping spike 118 is located a distance of $X_p$ from the left edge of avalanche layer 116. Doping spike 118 has a width of $\delta$ at approximately one-half the total height of the peak. The doping density of doping spike 118 closely resembles a normal distribution curve and it is assumed in the calculations used herein that it is indeed possible to approximate the shape of doping spike 118 by such a curve. The doping density of avalanche layer 118 falls off gradually to a value of $n_s$ at its surface. Throughout most of the width $W_D$ of drift region 120 the doping density is constant at a value of $n_D$. At the transition between drift region 120 and first buffer layer 122 the doping density increases rapidly in a short distance to a value of $n_{B2}$ for a distance of $W_{B2}$. The doping density again rises rapidly between first buffer layer 122 and second buffer layer 124 to a doping density of $n_{B1}$ for a distance of $W_{B1}$. Two buffer zones are preferred to provide a two-step transition between doping levels $n_D$ and $n_{B1}$ to provide a steeper initial slope at the transition point. Substrate 126 with a doping density of $n_{sub}$ is contiguous to second buffer layer 124 and has approximately the same doping density thereof.

Figure 3:
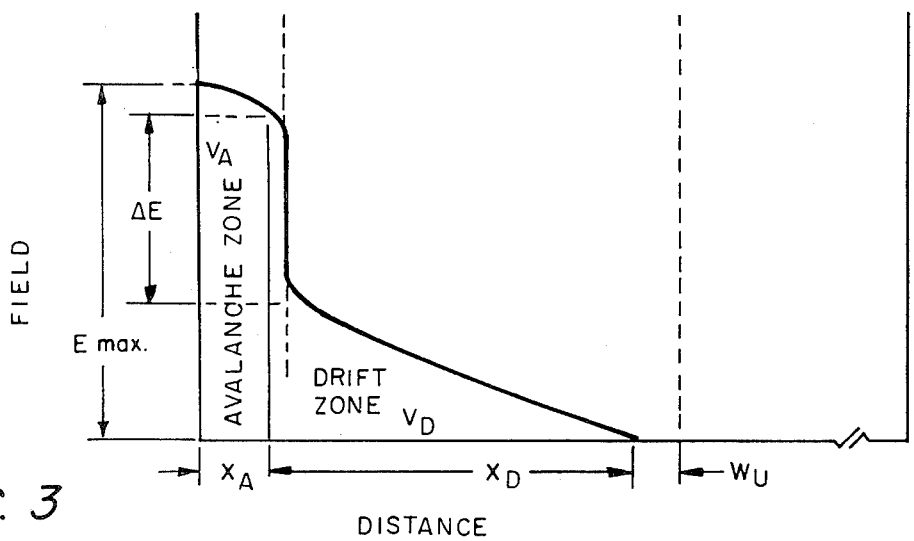
FIG. 3 shows the electric field distribution across the device of FIG. 1 with the reverse bias potential applied thereto.
Figure 5A:
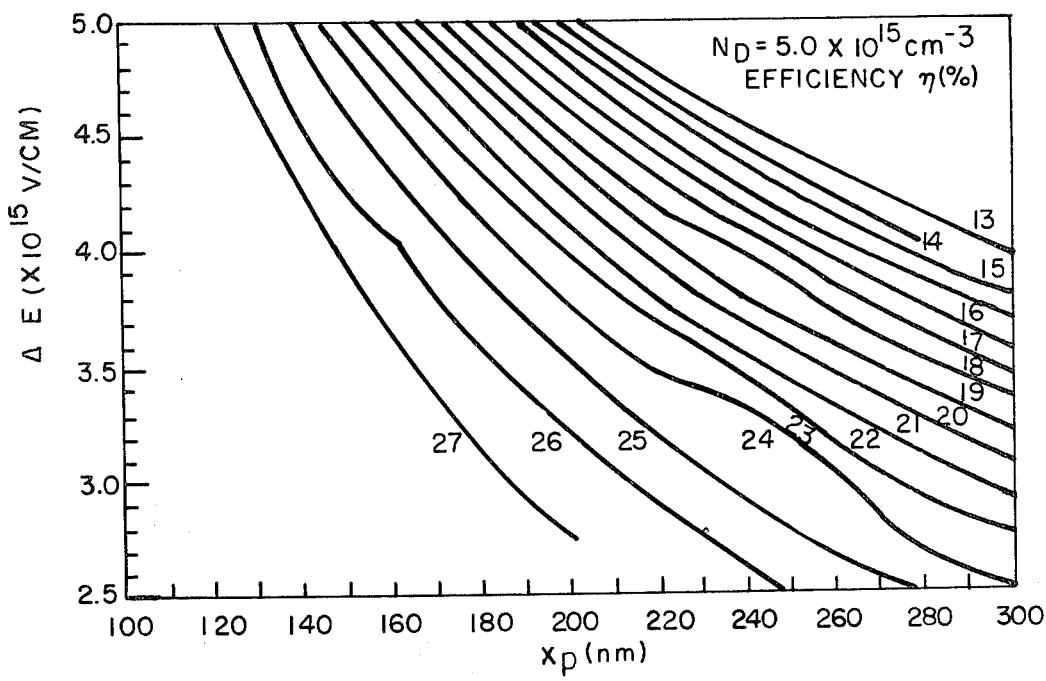
FIGS. 5A–10B are sets of graphs used in determining diode device parameters in accordance with the invention.
Figure 5B:
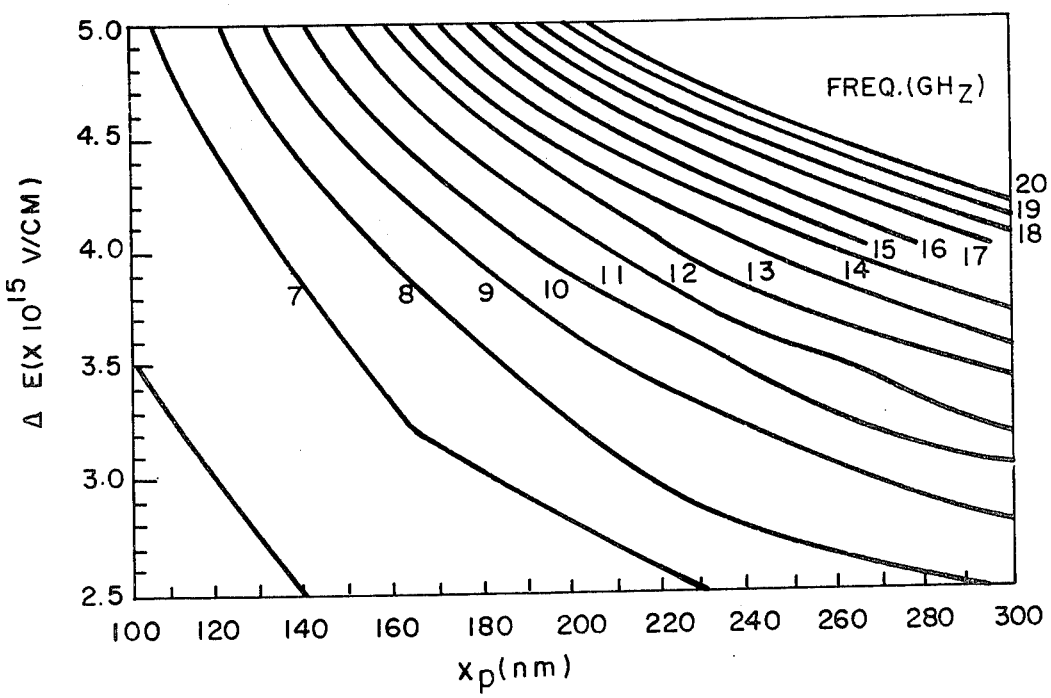
Figure 6A:
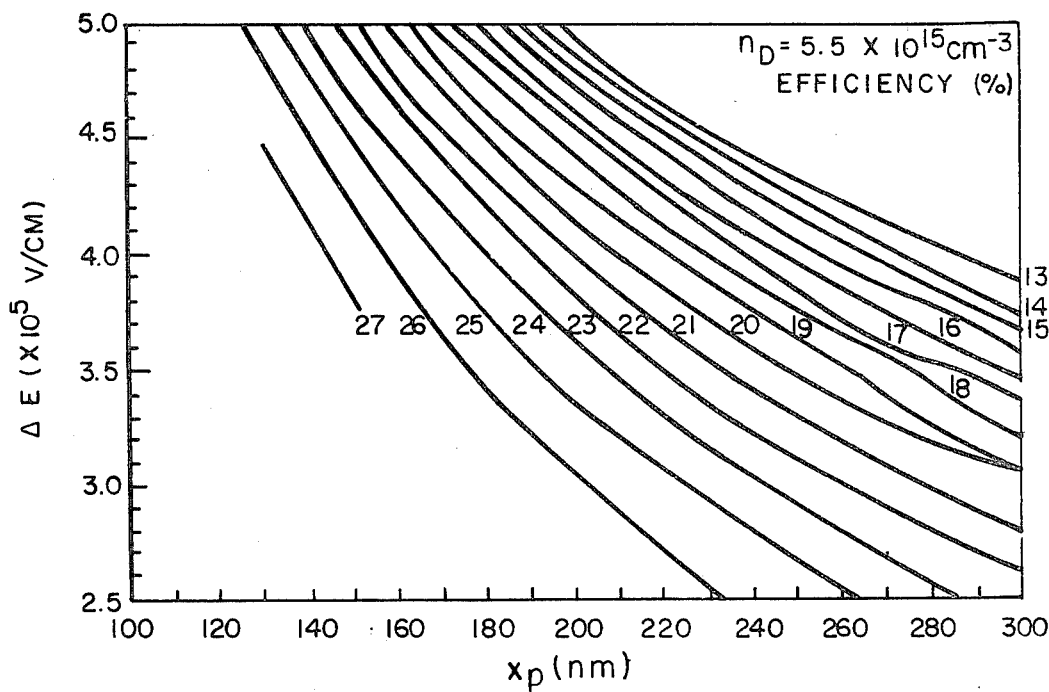
Figure 6B:
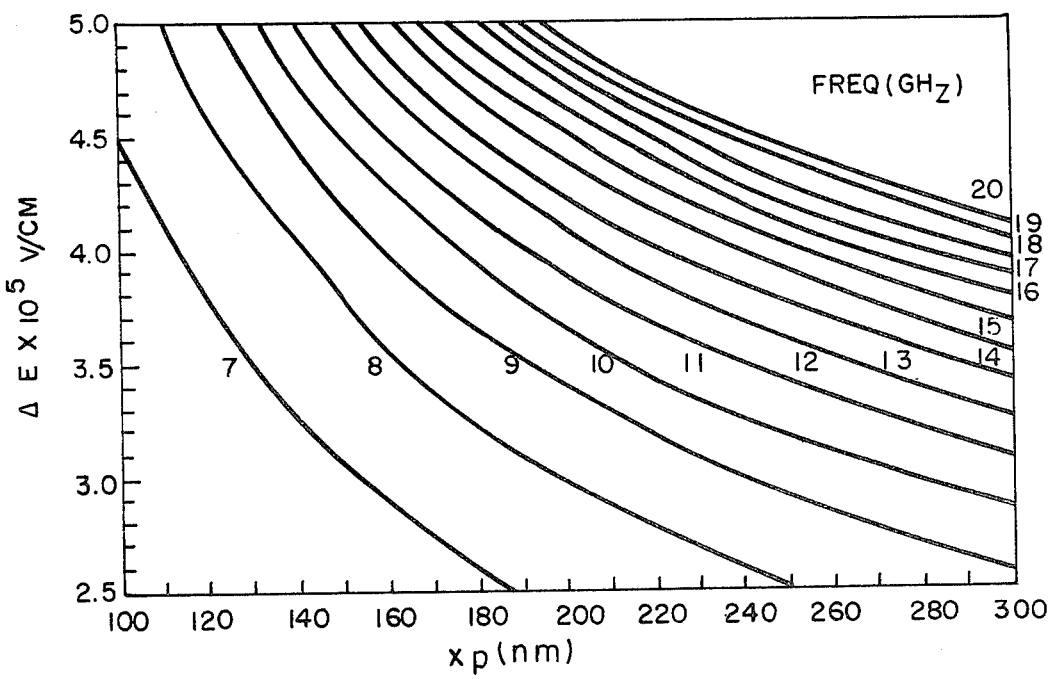
Figure 7A:
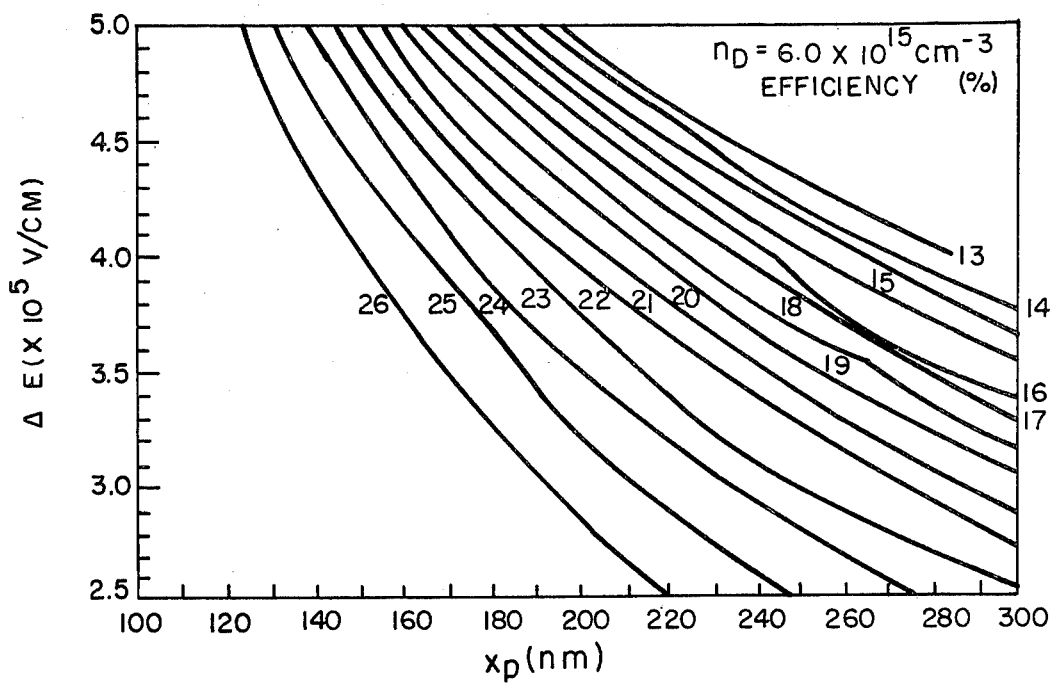
Figure 7B:
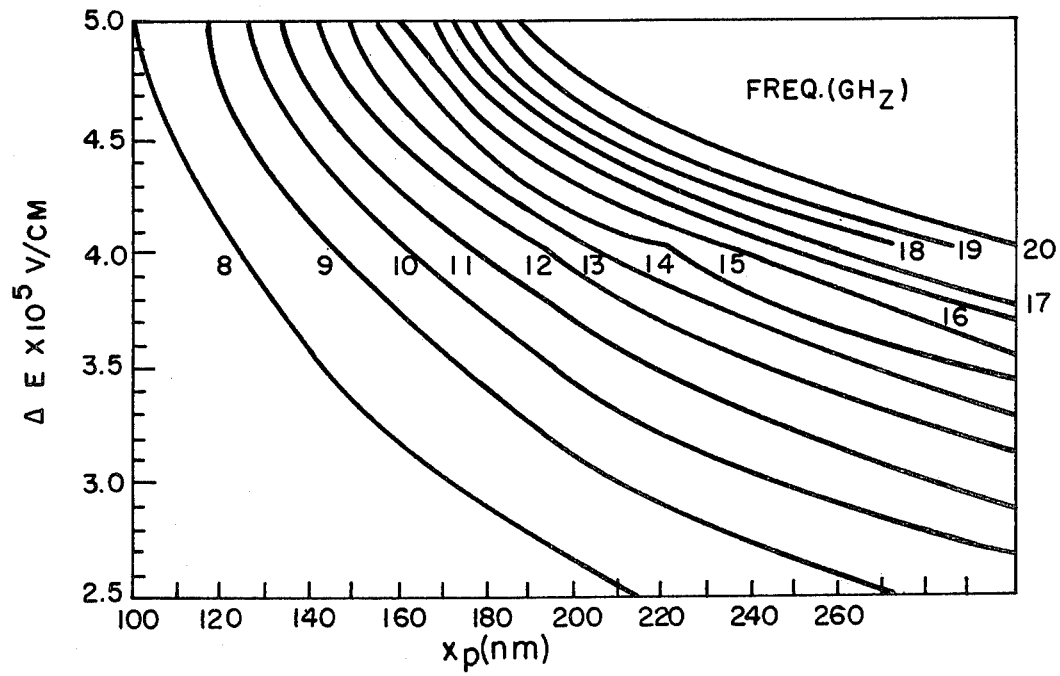
Figure 8A:
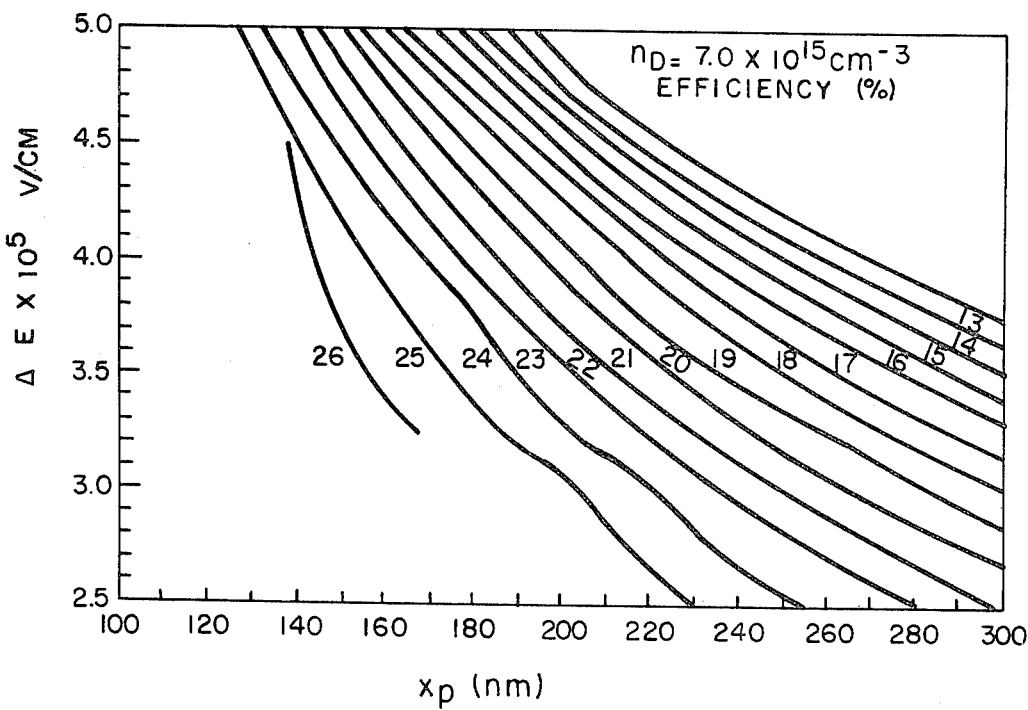
Figure 8B:
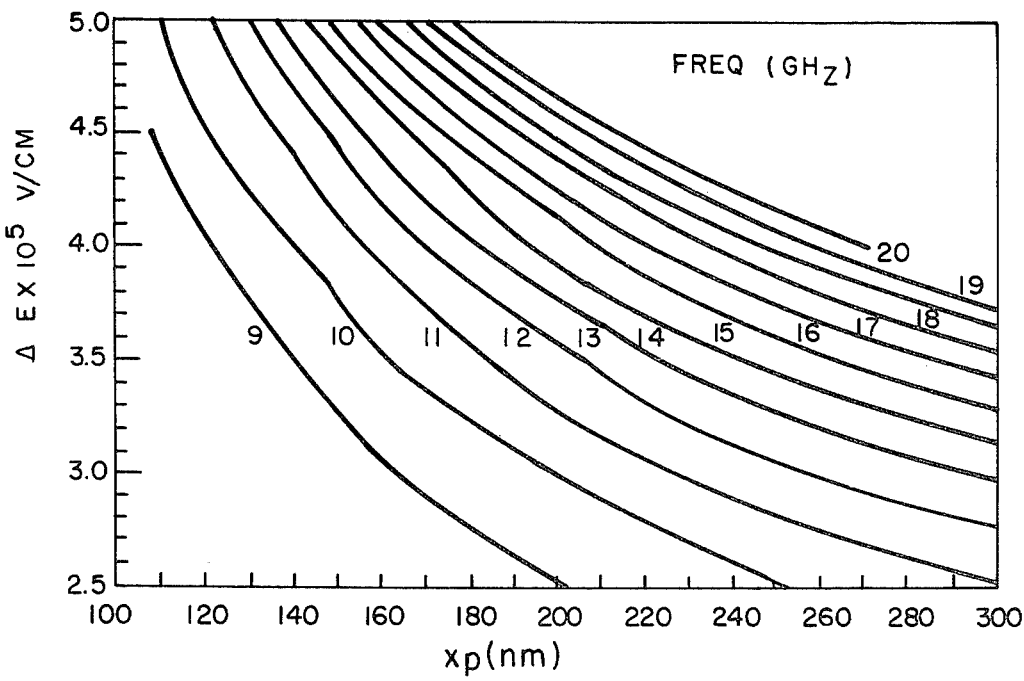
Figure 9A:
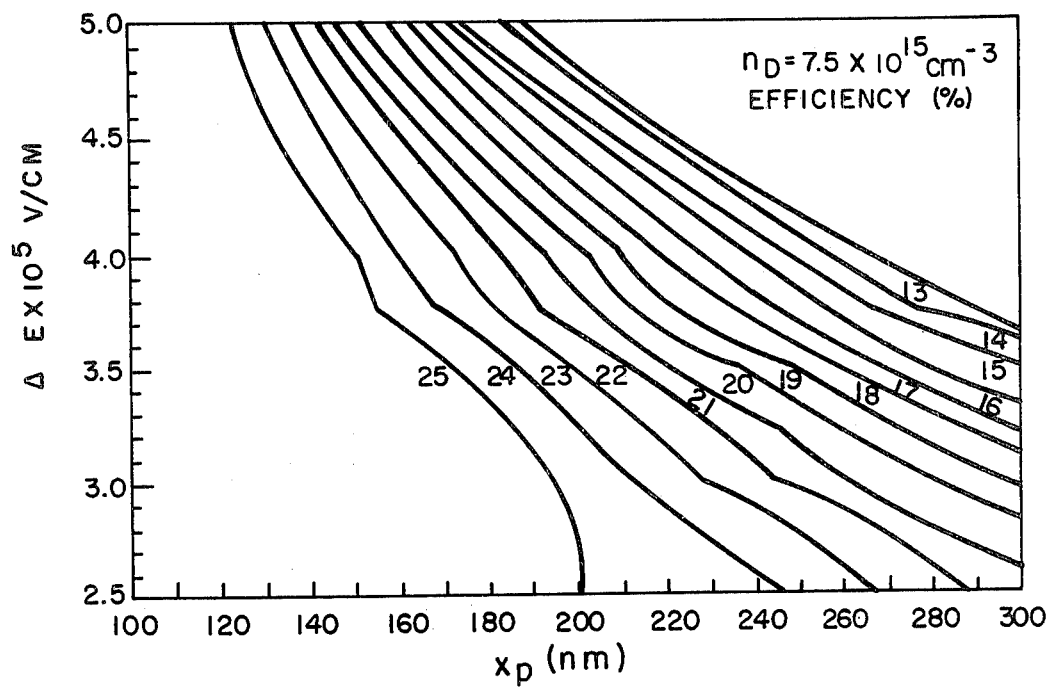
Figure 9B:
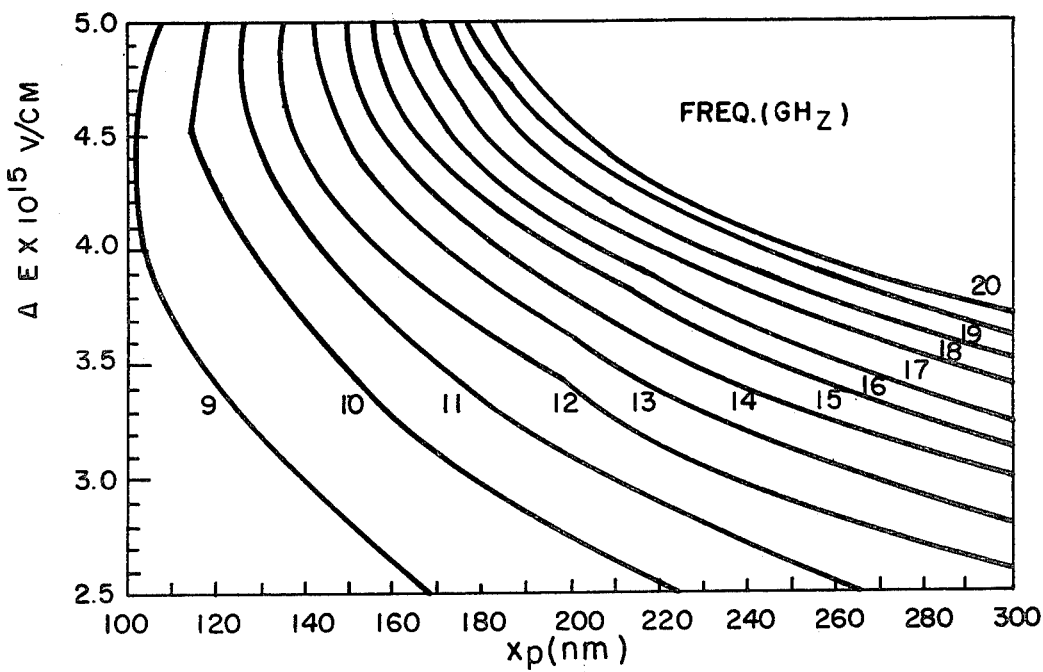
Figure 10A:
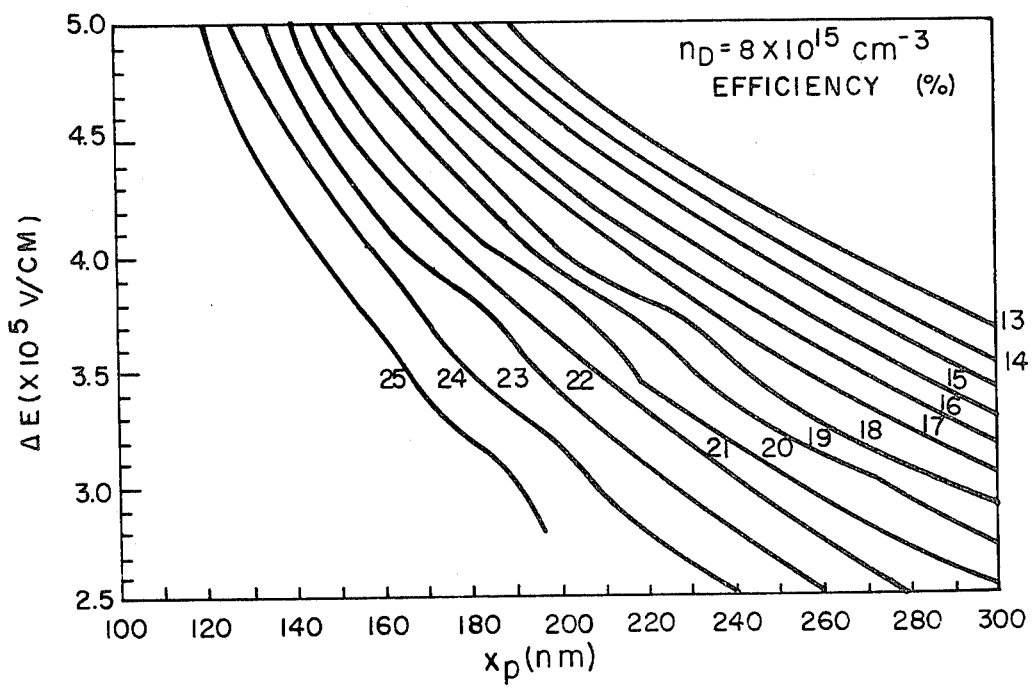
Figure 10B:
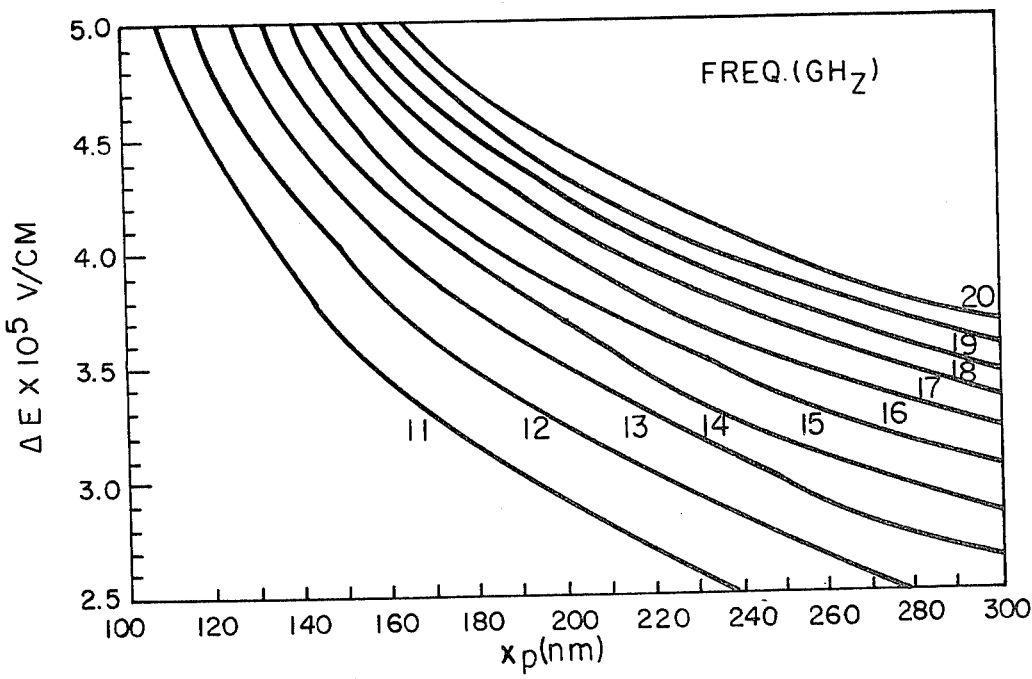

In FIG. 3 is shown a graph of the magnitude of the electric field within avalanche layer 116, doping spike 118, and drift region 120. The magnitude of the electric field is approximately constant within avalanche layer 116 for a distance of $X_A$ at a value of $E_{max}$. It is within this region that the electric field is sufficiently high to create an avalanche of majority carriers. At a distance of $X_A$ from the left edge of avalanche layer 116, which is at the edge of doping spike 118, the electric field begins to fall rapidly and drops by $\Delta E$ at the edge of drift region 120. The rapid drop in electric field is caused by the high value of doping density within doping spike 118. Within drift region 120 the electric field magnitude drops at a nearly constant rate throughout a distance $X_D$. The electric field magnitude becomes substantially zero a distance $W_u$ from the junction between drift region 120 and first buffer layer 122. Termination of the electric field before the end of drift region 120 prevents charge accumulation at the interface between drift region 120 and first buffer layer 122 caused by a capacitive effect. Charge accumulated in an interface in prior devices without termination of the electric field prior to the buffer layer would be pulled back through drift region 120 by the electric field out of phase with the useful current. The total useful current flow was thereby reduced and the efficiency of the device correspondingly also reduced.

Further, in accordance with the invention, a procedure is disclosed for determining the distance $(X_p)$ from the surface of contact layer 116 to the peak of doping spike 118 to achieve a predetermined efficiency with a predetermined amount of electrical field change $(\Delta E)$ at the edge of the avalanche region for a chosen operating frequency. First, the doping profile is computed using the predetermined values of $\Delta E$, $n_p$, and $X_p$ assuming the shape of the doping profile in the region of doping spike 118 has the shape of a normal or Gaussian distribution curve.

The doping profile function N(x) is thusly represented as:

$$n(x) = n_s + \frac{0.4\phi}{\sigma} \exp[-(x-X_p)^2/2\sigma^2] \text{ for } x < X_p \text{ and}$$

$$n(x) = n_p + \frac{0.4\phi}{\sigma} \exp[-(x-X_p)^2/2\sigma^2] \text{ for } x \geq X_p \text{ where}$$

$$\phi = \frac{\Delta E}{1.45 \times 10^{-7}} \text{ and } \sigma = \frac{0.4\phi}{n_p}.$$

The electric field intesnity is then computed from n(x) using the well-known integral relationship:

$$E(x) = q_e\epsilon_r\epsilon_o \int_{X_D}^{x} n(x)dx,$$

where $q_e$=electron charge, $\epsilon_r$=relative dielectric constant of the material, and $\epsilon_o$=dielectric constant of the space. For GaAs:

$$E(x) = -1.45 \times 10^{-7} \int_{X_D}^{x} n(x)dx.$$

The rate of production ($\alpha$) of charge carriers at any point by the avalanche phenomena in semiconductor material is relative to the electric field at that point by the well-known relationship:

$$\alpha = R \exp[-(G/E(x))^2],$$

where R and G have been empirically determined for GaAs to be $1.18 \times 10^5$ carriers/second and $5.55 \times 10^5$ volts/meter, respectively. The total current is $\alpha$ integrated throughout the entire semiconductor region:

$$I_{TOTAL} = \int_{0}^{X_D} \alpha(E(x))dx.$$

The avalanche region may be defined as the region where at least 95% of the charge carrier generation takes place. $X_A$, the length of the avalanche region may be calculated by finding that value of x for which the integral $$I = \int_{0}^{X} \alpha(E(x))dx = 0.95 \ I_{TOTAL}.$$

The efficiency (n) of a Read-type diode device may be approximated as:

$$n = 1/\pi \ V_D/V_T$$

where $V_D$ is the voltage across the drift region and $V_T$ is the total voltage across the device. (For a derivation of this approximation see Scharfetter and Gummel, "Large-Scale Analysis of a Silicon Read Diode Oscillator," *IEEE Transactions on Electron Devices*, Vol. ED-16, No. 1, pp. 64–65, January 1969.) $V_D$ and $V_T$ may be calculated by integrating the electric field with respect to x through the drift region, that is, from 0 to $X_A$, and throughout the entire device, respectively.

It has been empirically determined that with GaAs diode devices in accordance with the invention the most efficient operating frequency is related to the length $(X_D)$ of the drift region by $$f(\text{in GHz}) = 31/X_D (\text{in } \mu\text{m}).$$

Using this expression and the formulas above, sets of parametric curves may be prepared, preferably with the use of a computer, showing lines of constant efficiency and lines of constant frequency plotted against $\Delta E$ and $X_p$. Six sets of such curves are shown herein as FIGS. 5A–10B. Each set is for a different drift region doping density.

Preferably each set of curves is prepared in overlay form. That is, each of the A set of curves (5A, 6A, . . . , 10A) is placed over the corresponding B set of curves (5B, 6B, . . . , 10B). The intersection of the efficiency and frequency curves yields the requisite values of $\Delta E$ $X_p$. The diode may then be constructed using the approximation $\delta n_p = \Delta E/1.447 \times 10^7$. This approximation is based upon the assumption of a Gaussian distribution curve shape of the doping spike.

It may be necessary to examine intersection points upon more than one set of curves to find an intersection point that yields convenient values of $\Delta E$ and $X_p$. For example, for a 10 GHz, 25% efficient device, if $n_D$ is chosen as $5.0 \times 10^{15}/cm^3$ a very large $\Delta E$ ($>5 \times 10^5$ V/cm) and very small $X_p$ ($<35$ nm) would result. A more readily realizable $\Delta E$ and $X_p$ are made possible using $n_D = 5.5 \times 10^{15}/cm^3$. However, with $n_D = 6.0 \times 10^{15}/cm^3$, $\Delta E \approx 3.7 \times 10^5$ V/cm and $X_p \sim 180$ nm, which are both convenient and realizable values. Of course, the curves shown are by way of illustration only. Other parameter values or values intermediate those shown may be used as well.

Referring now to FIG. 4 there is shown therein in schematic form apparatus for producing diodes as that shown in cross-sectional view in FIG. 1. The process for producing diodes such as that shown in FIG. 1 will also now be described.

Fabrication and growth of diodes in accordance with the invention is accomplished within multiple temperature zone furnace 438 and further within glass or ceramic furnace tube 446 placed within multiple temperature zone furnace 438. A wafer 444 of highly doped single crystal gallium arsenide material is placed within furnace tube 446 upon the end of wafer support 442. The outer flat surface of wafer 444 is oriented perpendicular to the center axis of furnace tube 446. Wafer 442 forms substrate 126 of the diode device shown in FIG. 1. Tellurium is the preferred dopant for wafer 444 although other n++ dopants such as silicon may be used as well. Doping densities in the range $1 \times 10^{18}/cm^3$ to $4 \times 10^{18}/cm^3$ are preferred. Any reasonable thickness may be used as the wafer 444 will later be thinned. Of course, many separate and identical diode devices are produced at one time upon wafer 444. The individual diode device chips are scribed and cut from the finished wafer.

After wafer 444 has been mounted within furnace tube 446, all atmospheric gases should be purged from the interior of the tube and dry hydrogen introduced therein. The temperature within multiple temperature zone furnace 438 is raised to the preferred temperature profile. With the preferred method, wafer 444 is held at a temperature of 744° C. and gallium boat 432 is at 820° C. Other temperatures may be used as well depending upon the growth rate desired. Four intermediate temperature zones are provided between gallium boat 432 and wafer 444 to provide an approximately linearly declining temperature profile between gallium boat 432 and wafer 444.

The outwardly exposed surface of wafer 444 is cleaned and etched before growth of regions other than substrate 126 are commenced. When wafer 444 has reached its stable heated temperature, etch bubbler solenoid valves 412 and growth bubbler solenoid values 422 are opened. Pure dry hydrogen then flows through pressure regulator 450, and flow meters 448, 452 and 418 in the direction indicated by arrows into the center of etch bubbler 424 and growth bubbler 428. Etch bubbler 424 and growth bubbler 428 each contain liquid arsenic trichloride ($AsCl_3$). The liquid $AsCl_3$ within each etch bubbler is maintained at a constant temperature in the range of 0° C. to 20° C. by coolant fluid 430 constantly circulated through cooling jackets 426 which surround each reservoir of $AsCl_3$. The hydrogen gas bubbled through etch bubbler 424 and growth bubbler 428 picks up molecules of $AsCl_3$ as the hydrogen bubbles through the fluid $AsCl_3$. A mixture of hydrogen and $AsCl_3$ emerges from growth line 434 upstream from gallium boat 432 and from dope/etch line 436 downstream from gallium boat 432. The gaseous hydrogen and $AsCl_3$ are in chemical equilibrium at the preferred operating temperatures with gaseous arsenic and gaseous hydrogen chloride (HCl) in accordance with the following equation:

$$6 H_2(g) + 4 AsCl_3 \rightleftharpoons As_4(g) + 12 HCl(g).$$

The gaseous quadrivalent arsenic from growth line 434 reacts with the metallic gallium forming a coating of GaAs upon the upper surface of the metallic gallium. The reaction continues until saturation is reached. The gaseous HCl, primarily from dope/etch line 436, etches the surface of wafer 444 thereby freeing it from contaminants. Preferably 5 to 10 micrometers of the surface of wafer 444 is etched away.

When the surface of wafer 444 has been etched and a saturated coating of GaAs produced atop the supply of metallic gallium, first and second buffer zones 122 and 124 are grown upon substrate 126. Etch bubbler solenoid values 412 are deactivated while growth bubbler solenoid values 422 remain activated. A nearly instantaneous transition from vapor etch to epitaxial growth is produced. The exposed and previously etched surface of wafer 444 acts as a nucleation site for vapors of GaAs produced atop metallic gallium 454. During the growth process, GaAs is continually produced to replace that consumed by the epitaxial growth process by the continuous flow of vapors from growth line 434 across gallium boat 432.

While GaAs is being epitaxially grown upon wafer 444, dopant material is continuously introduced through dope/etch line 436 at a rate to produce the preferred doping levels. Hydrogen is supplied through pressure regulator 402, hydrogen intake solenoid 456, and one each flow meters 406 and 418. Simultaneously, a mixture of hydrogen and a dopant gas are supplied through pressure regulator 404, the other one of flow meters 406 and another one of flow meters 418. In the preferred embodiment, sulfur is the dopant and is supplied as $H_2S$ at 500 ppm in relation to the hydrogen initially mixed therewith. The two streams are merged and passed through reservoir solenoid 408 and dope-/etch solenoid valves 420 and 421 in turn to dope/etch line 436. The gaseous $H_2S$ dissociates into gaseous hydrogen and sulfur at the preferred operating temperatures. First and second buffer layers 122 and 124 and drift region 120 are each sequentially grown with the preferred lengths and doping densities by varying the growth times and dopant flow rates accordingly.

Once drift region 120 has been grown to the proper length in accordance with the preferred operating frequency of the completed device, doping spike 118 is grown. The dopant material for growing dopant spike 118 is pre-stored in constant volume reservoir 416. At the time doping spike 118 is to be grown, dope/etch solenoid valve 420 is deactivated while dope/etch solenoid valve 421 switches from permitting flow only between its left and right ports (as shown in FIG. 4) permitting flow only between the upper and right ports. The entire contents of constant volume reservoir 416 are quickly emptied through dope/etch line 436 propelled only by hydrogen gas. Doping spike 118 is grown during the short time that dopant flows from constant volume reservoir 416. Of course, GaAs production from the vapors from growth line 434 continues as normal during the growth time of doping spike 118. When constant volume reservoir 416 is emptied, only hydrogen enters furnace tube 446 through dope-etch line 436. Contact layer 116 is then grown over doping spike 118 to a controlled depth by simply continuing to grow GaAs until the preferred thickness is reached.

It is an advantage with the invention that the shape of the doping profile of doping spike 118 can be closely controlled. The height $n_p$ and width $\delta$ of doping spike 118 are set by the pressure of the propelling hydrogen relative to the pressure within furnace tube 446, the amount of dopant material within constant volume reservoir 416, and the shape of constant volume reservoir 416. In the preferred embodiment, constant volume reservoir 416 is formed from a section of tubing of predetermined length and volume. The width of doping spike 118 can be increased, for example, by lengthening the tubing.

To complete the device to the extent shown in FIG. 1, a Schottky barrier contact is deposited over the exposed end of contact layer 116. Preferably, chromium is sputter deposited over the exposed end of contact layer 116 to a thickness of approximately 200 Å. Chromium is preferred as that metal results in less metal atom migration into contact layer 116 than other Schottky barrier contact forming metals. Over the chromium layer is sputter deposited a layer of titanium to a preferred thickness of 2000 Å. Gold is then sputter deposited over the titanium layer with an approximate thickness of 2000 Å. The titanium layer is used to prevent the migration of gold atoms through the chromium layer to contact layer 116. Finally gold heat sink 112, which may be of any desired thickness, is attached to the sputter-deposited gold layer. Substrate 126 is thinned to a preferred thickness of 0.4 mm and ohmic contact 128 attached. Diode device 100 may then be packaged for circuit use.

This concludes the description of the preferred embodiments of the invention. Although preferred embodiments have been described, it is believed that numerous modifications and alterations thereto would be apparent to one skilled in the art without departing from the spirit and scope of the invention.

What is claimed is:

1. A method for producing a doping spike for terminating an avalanche region in a diode device comprising the steps of:
    vapor depositing a drift region layer of semiconductor material upon a substrate; and
    injecting a predetermined quantity of a pre-selected dopant material toward said substrate, said predetermined quantity of dopant material being vapor deposited upon said drift region and forming said doping spike.

2. The method of claim 1 wherein said semiconductor material comprises gallium arsenide.

3. The method of claim 2 further comprising the step of: vapor depositing an avalanche layer over said doping spike.

4. The method of claim 3 wherein said substrate is located within a furnace tube and maintained at a predetermined temperature.

5. The method of claim 4 wherein said predetermined quantity of dopant material is pre-stored in a reservoir having a predetermined volume.

6. The method of claim 4 wherein said dopant material is selected from the group consisting of an arsenide compound, sulfur, tellurium, tin and selenium for an N-type substrate and zinc and cadmium for a P-type substrate.

7. The method of claim 4 wherein said dopant material comprises hydrogen sulfide mixed with hydrogen.

8. A method for producing a modified Read-type diode device comprising the steps of:
    providing a wafer of semiconductor material, said wafer being placed within a furnace tube, the temperature within said furnace tube being maintained at predetermined values;
    vapor depositing one or more buffer zones of semiconductor material upon said substrate, said substrate and said buffer zones being substantially highly doped;
    vapor depositing a drift region layer upon said buffer zones, said drift region layer being substantially lightly doped and the length of said drift region layer being determined in accordance with a preferred operating frequency of said device;
    vapor depositing a doping spike layer upon said drift region layer, said vapor depositing said doping spike comprising injecting a predetermined quantity of dopant material within said furnace tube;
    vapor depositing an avalanche region layer upon said doping spike layer; and
    providing junction forming means upon said avalanche region layer.

9. The method of claim 8 wherein each of said layers comprises gallium arsenide.

10. The method of claim 9 wherein said junction forming means comprises a Schottky barrier contact.

11. The method of claim 10 wherein said Schottky barrier contact comprises:
    a layer of chromium upon said avalanche layer;
    a layer of titanium upon said layer of chromium; and
    one or more layers of gold upon said layer of titanium.

12. The method of claim 10 wherein said step of vapor depositing said doping spike comprises the steps of:
    pre-storing said predetermined quantity of said dopant material in a reservoir of predetermined volume; and
    injecting said predetermined quantity of dopant material into said furnace tube.

13. The method of claim 12 wherein said step of injecting comprises propelling said predetermined quantity of dopant material with a gas.

14. The method of claim 13 wherein said dopant material comprises hydrogen sulfide and said gas comprises hydrogen.

* * * * *